US009342400B2

(12) United States Patent
Nabhane et al.

(10) Patent No.: US 9,342,400 B2
(45) Date of Patent: May 17, 2016

(54) DYNAMIC POWER PROFILING

(71) Applicant: Broadcom Corporation, Irvine, CA (US)

(72) Inventors: Walid Nabhane, Long Valley, NJ (US); Mark D. Rutherford, Wellington, CO (US); Chun-Nan Ke, Hsinchu (TW); Veronica Alarcon, San Jose, CA (US); John Russell Platenak, Fort Collins, CO (US); Arun Palaniappan, Fort Collins, CO (US)

(73) Assignee: BROADCOM CORPORATION, Irvine, CA (US)

( * ) Notice: Subject to any disclaimer, the term of this patent is extended or adjusted under 35 U.S.C. 154(b) by 134 days.

(21) Appl. No.: 13/950,750

(22) Filed: Jul. 25, 2013

(65) Prior Publication Data

US 2014/0218011 A1 Aug. 7, 2014

Related U.S. Application Data

(60) Provisional application No. 61/759,470, filed on Feb. 1, 2013, provisional application No. 61/833,598, filed on Jun. 11, 2013, provisional application No. 61/834,513, filed on Jun. 13, 2013, provisional application No. 61/836,327, filed on Jun. 18, 2013, provisional application No. 61/836,306, filed on Jun. 18, 2013, provisional application No. 61/836,895, filed on Jun. 19, 2013, provisional application No. 61/836,886, filed on Jun. 19, 2013, provisional application No. 61/836,903, filed on Jun. 19, 2013.

(51) Int. Cl.
*G01R 19/00* (2006.01)
*G06F 11/10* (2006.01)
*G05F 1/625* (2006.01)
(Continued)

(52) U.S. Cl.
CPC ............ *G06F 11/1048* (2013.01); *G01R 31/36* (2013.01); *G05F 1/625* (2013.01); *G06F 1/26* (2013.01); *G06F 1/3206* (2013.01); *G06F 1/3287* (2013.01); *G06F 11/1016* (2013.01); *G06F 11/3062* (2013.01); *G06F 11/3093* (2013.01); *G06F 13/126* (2013.01); *G11C 7/106* (2013.01); *G11C 7/1072* (2013.01); *H02J 7/0029* (2013.01); *G01R 19/003* (2013.01); *G01R 31/40* (2013.01); *G06F 11/3031* (2013.01); *G06F 11/3058* (2013.01)

(58) Field of Classification Search
CPC ...... G01R 19/003; G01R 31/36; G01R 31/40; G01R 31/42; G06F 1/26; G06F 11/3062; G06F 1/3212; G06F 1/3206; Y02B 60/1292; Y02B 60/50
USPC ......... 324/113, 252, 426, 433, 509, 663, 679, 324/713
See application file for complete search history.

(56) References Cited

U.S. PATENT DOCUMENTS 5,936,520 A * 8/1999 Luitje et al. .................. 340/517
2007/0170909 A1 * 7/2007 Vorenkamp et al. ....... 324/76.11
(Continued)

*Primary Examiner* — Alesa Allgood
(74) *Attorney, Agent, or Firm* — Oblon, McClelland, Maier & Neustadt, L.L.P.

(57) ABSTRACT

Aspects of dynamic power profiling are described herein. In various embodiments, a current sense operating mode is set for a current sense circuit, and the current sense circuit is enabled for operation. The current sense circuit senses an amount of current supplied by at least one of a plurality of power rails based on the current sense operating mode. The current sense circuit also accumulates and stores a value of the amount of current over a period of time. In certain aspects, a system controller averages the value of the amount of current based on the period of time. The current sense circuit may be configured to operate in various modes of operation including single or scan rail modes of operation, and the average of the value of the amount of current may be evaluated based on the modes of operation of the current sense circuit and/or the system.

12 Claims, 6 Drawing Sheets

(51) Int. Cl.
*G06F 13/12* (2006.01)
*G06F 1/26* (2006.01)
*G01R 31/36* (2006.01)
*H02J 7/00* (2006.01)
*G06F 1/32* (2006.01)
*G11C 7/10* (2006.01)
*G06F 11/30* (2006.01)
*G01R 31/40* (2014.01)

(56) References Cited

U.S. PATENT DOCUMENTS

2012/0191160 A1* 7/2012 Moghe .................. A61N 1/3706
607/57
2013/0120010 A1* 5/2013 Edgar, III ............... G01R 21/06
324/750.01

* cited by examiner

DYNAMIC POWER PROFILING

CROSS-REFERENCE TO RELATED APPLICATIONS

This application claims the benefit of:

U.S. Provisional Application No. 61/759,470, filed Feb. 1, 2013;

U.S. Provisional Application No. 61/833,598, filed Jun. 11, 2013;

U.S. Provisional Application No. 61/834,513, filed Jun. 13, 2013;

U.S. Provisional Application No. 61/836,327, filed Jun. 18, 2013;

U.S. Provisional Application No. 61/836,306, filed Jun. 18, 2013;

U.S. Provisional Application No. 61/836,895, filed Jun. 19, 2013;

U.S. Provisional Application No. 61/836,886, filed Jun. 19, 2013; and

U.S. Provisional Application No. 61/836,903, filed Jun. 19, 2013, the entire contents of each of which are hereby incorporated herein by reference.

This application also makes reference to:

U.S. patent application Ser. No. 13/950,716, titled "Clock Domain Crossing Serial Interface, Direct Latching, and Response Codes" and filed on even date herewith;

U.S. patent application Ser. No. 13/950,725, titled "Power and System Management Information Visibility" and filed on even date herewith;

U.S. patent application Ser. No. 13/950,738, titled "Power Mode Register Reduction and Power Rail Bring Up Enhancement" and filed on even date herewith;

U.S. patent application Ser. No. 13/950,762, titled "Charger Detection and Optimization Prior to Host Control" and filed on even date herewith;

U.S. patent application Ser. No. 13/950,769, titled "Enhanced Recovery Mechanism" and filed on even date herewith; and U.S. patent application Ser. No. 13/950,776, titled "Dynamic Power Mode Switching Per Rail" and filed on even date herewith, the entire contents of each of which are hereby incorporated herein by reference.

BACKGROUND

Battery-powered computing systems and devices have been adopted for use in many aspects of daily life. As these systems and devices are more widely adopted and used in place of other computing systems and devices, they are designed to be more flexible and powerful, but are also more complex. With advances in the design of battery-powered computing devices, the availability of sufficient power for the devices continues to be an ongoing concern. For example, each new feature in a battery-powered computing device may require the provision of circuitry that supports a supply of power for the feature.

In the context of system power management, some battery-powered computing systems include power management processing circuitry that manages the supply of power in the system. Over time, this power management processing circuitry may need to adapt to certain needs in battery-operated systems.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

In the context of system power management, some battery-powered computing systems include power management processing circuitry that manages the supply of power in the system. Over time, this power management processing circuitry may need to adapt to certain needs in battery-operated systems, such as the need for measurement and profiling of power consumed by various subsystems per power rail.

Additionally, the need for power management processing circuitry to identify the consumption of per-rail power is now more important, especially as the number of power rails continues to grow and integrated semiconductor circuitry continues to shrink in size. For example, without the ability to identify the consumption of per-rail power, it might not be possible to identify whether a certain subsystem is operating outside its nominal or expected operating parameters. Further, as semiconductor circuitry continues to shrink in size, current leakage, which is variable in part based on temperature, has become a greater problem. Although an amount of current leakage may be expected and semiconductor circuitry may be characterized to determine an expected amount of current leakage, it has become more difficult in new systems to rely upon an assumed or expected amount of current leakage. Similarly, it has become more difficult in new systems to rely upon an assumed or expected amount of current consumption for subsystems. When accurate power usage measurements and statistics are unavailable, poor overall power management may result.

In this context, aspects of dynamic power profiling are described herein. In various embodiments, a current sense operating mode is set for a current sense circuit, and the current sense circuit is enabled for operation. The current sense circuit senses an amount of current supplied by at least one of a plurality of power rails based on the current sense operating mode. The current sense circuit also accumulates and stores a value of the amount of current over a period of time. In certain aspects, a system controller averages the value of the amount of current based on the period of time. The current sense circuit may be configured to operate in various modes of operation including single or scan rail modes of operation, and the average of the value of the amount of current may be evaluated based on the modes of operation of the current sense circuit and/or the system.

Turning now to the drawings, an introduction and general description of exemplary embodiments of a system is provided, followed by a description of the operation of the same.

I. System Introduction

Figure 1:
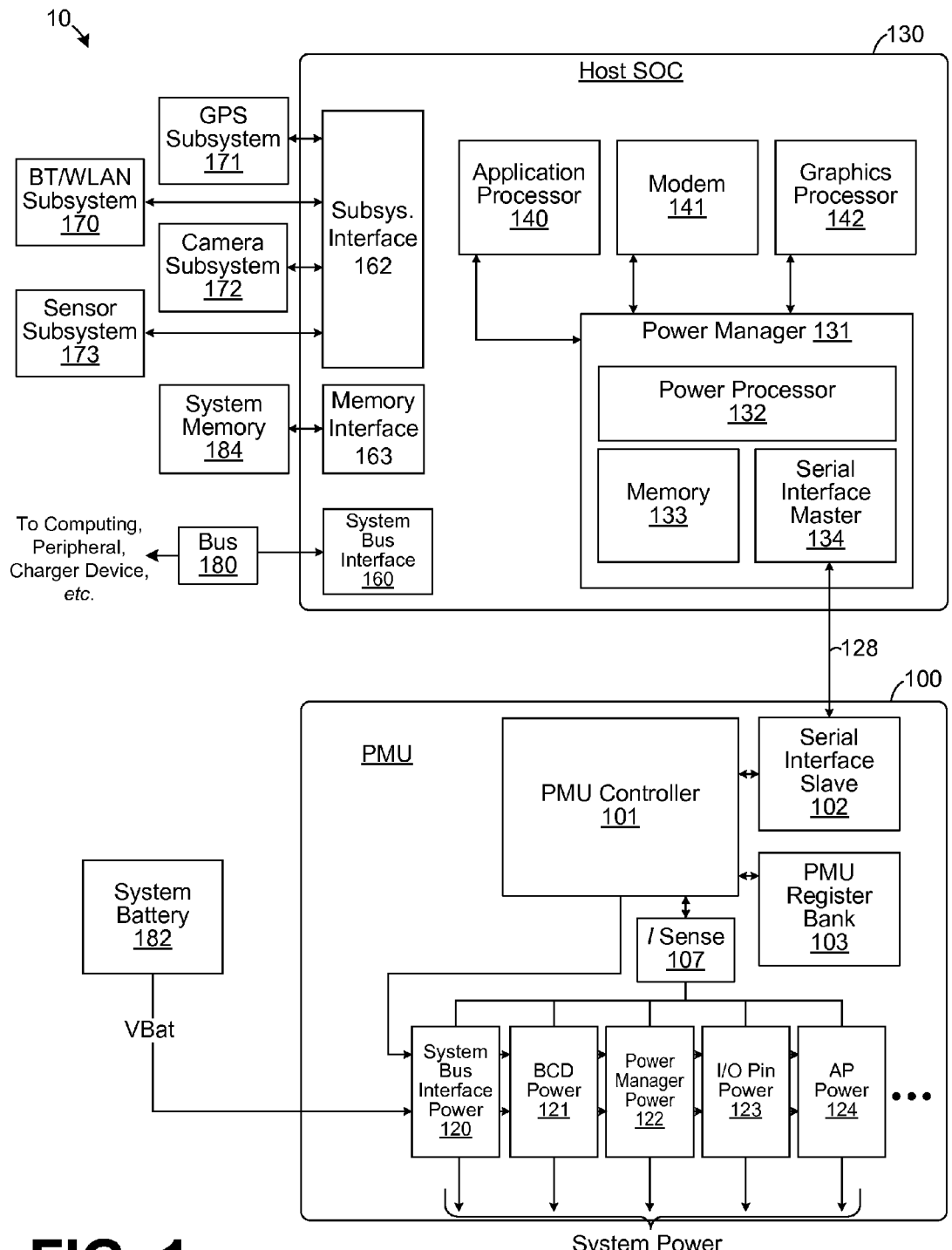
FIG. 1 illustrates a system for dynamic power profiling according to an example embodiment.

FIG. 1 illustrates a system 10 for dynamic power profiling according to an example embodiment. The system 10 may embody a computing device that includes a number of general and/or specific purpose circuits, processing circuits, processors, registers, memories, sensors, displays, etc. In one embodiment, the system 10 may embody a handheld or portable computing device which is powered from charge stored in a battery. In various embodiments, the system 10 may be embodied as part of a cellular telephone, tablet computing device, laptop computer, or other computing device. Alternatively, because the embodiments described herein are not limited to use in handheld or portable computing devices, the system 10 may be embodied as part of a desktop or set top computing device, for example. Although not illustrated in FIG. 1, it should be appreciated that the system 10 may include one or more displays, microphones, speakers, buttons, indicator lights, haptic feedback elements, memory card readers, etc.

Among other elements, the system 10 includes a power management unit (PMU) 100, a host system-on-chip (SOC) 130, a system bus 180, a system battery 182, and a system memory 184. The system 10 also includes certain subsystems such as a bluetooth/wireless local area network (WLAN) subsystem 170, a global positioning system (GPS) subsystem 171, a camera subsystem 172, and a sensor subsystem 173. The subsystems 170-173 are representative subsystems which may be included as elements of the system 10, and other subsystems are within the scope and spirit of the embodiments described herein. It is noted that, just as the host SOC 130 requires power for operation, each of the subsystems 170-173, the system memory 184, and other elements and circuits of the system 10 depend on power for operation. As discussed below, this power may be supplied by and under the control of the PMU 100.

The system bus 180 of the system 10 is electrically and communicatively coupled among the PMU 100 and the host SOC 130. As discussed herein, the system bus 180 may be relied upon by the system 10 for both data communications to external computing systems and peripherals, and to electrically couple a supply of power to the system 10 for charging the system battery 182. The system bus 180 may include any communications bus suitable for the application, such as the universal serial bus (USB), although the use of other serial and/or parallel bus topologies are within the scope and spirit of the embodiments described herein.

The system battery 182 may be embodied as any rechargeable battery suitable for the application, such as a lithium-ion, nickel-metal-hydride, or other battery variant, without limitation. The system memory 184 may be embodied as a volatile and/or non-volatile random access memory or combination thereof. The system memory 184 may store computer-readable instructions thereon that, when executed by one or more of the processors 140-142 of the host SOC 130, for example, direct the processors 140-142 to execute various aspects of the embodiments described herein.

In general, the PMU 100 controls and/or facilitates control of the distribution of power from the system battery 182 to the elements of the system 10, such as the host SOC 130, the subsystems 170-173, and the system memory 184, for example. As further described below, depending upon the operating state of the system 10 and/or other factors, the PMU 100 may control the distribution of power to one or more elements of the system 10, or the PMU 100 may receive instructions to control the distribution of power to one or more elements of the system 10.

Among other elements, the PMU 100 includes a PMU controller 101, a serial interface slave 102, a PMU register bank 103, a current (I) sense circuit 107, and a number of power rail circuits 120-124. It is noted that FIG. 1 illustrates a representative example of elements of the PMU 100, and it should be appreciated that the PMU 100 may include other elements in various embodiments. That is, the PMU 100 may include a number of power rail circuits in addition to the power rail circuits 120-124. For example, the PMU 100 may include an additional power rail circuit to provide power for the system memory 184, among other additional power rails.

Among other elements, the host SOC 130 includes general and/or application specific processors. In FIG. 1, the host SOC 130 includes a power manager 131, an application processor 140, a modem 141, and a graphics processor 142. In various embodiments, the host SOC 130 may omit one or more of the processors 140-142 or include processors in addition to the processors 140-142. The host SOC 130 also includes a system bus interface 160, a subsystem interface 162, and memory interface 163. The subsystem interface 162, the memory interface 163, and the system bus interface 160 electrically and communicatively couple the subsystems 170-173, the system memory 184, and the system bus 180 to the host SOC 130 and, particularly, to one or more of the processors 140-142.

The application processor 140 may be embodied as a general purpose processor for executing various applications. For example, the application processor 140 may execute an underlying operating system along with applications such as e-mail, short message service (SMS), telephone, camera, web-browser, and other applications, without limitation. As compared to the PMU 100 and/or the power manager 131, the application processor 140 may consume relatively more power during operation. The modem 141 may include a cellular-based (or similar) communications processor for the communication of data wirelessly in connection with radio-frequency front end circuitry, and the graphics processor 142 may include a processor for driving a display of the system 10.

The power manager 131 includes a power processor 132, a memory 133, and a serial interface master 134. The power processor 132 may be embodied as a relatively small and low power processor or processing circuit for interfacing with the PMU 100 via a serial interface 128. In one embodiment, the serial interface master 134 of the power manager 131 controls the serial interface 128, although the PMU 100 may control the serial interface 128 in other embodiments. The memory 133 stores computer-readable instructions for execution by the power processor 132.

It is noted that, in certain embodiments, the host SOC 130 (including the power processor 132) and the PMU 100 may be combined in an integrated circuit. In this case, the serial interface 128 may be omitted.

II. System Operation

With reference to the elements of the system 10 introduced above, aspects of the operation of the system 10 are described below.

A. PMU Operation

The PMU 100 may be designed, adapted, and configured to perform operations that support the host SOC 130, the subsystems 170-173, the system memory 184, and other elements of the system 10. Generally, the PMU 100 is designed to consume a relatively small amount of power from the system battery 182 because power may be limited and the system battery 182 may be discharging. As one operational aspect of the PMU 100, the PMU 100 supplies power from the system battery 182 to other elements of the system 10 via the power rails 120-124. Further, when the system 10 is coupled to charging power via the system bus 180, the PMU 100 may charge the system battery 182. In certain aspects, the PMU 100 may monitor the voltage VBat of the system battery 182 and store a value of the voltage in the PMU register bank 103.

In other operational aspects of the PMU 100, the PMU controller 101 coordinates and controls the operations of the PMU 100. The PMU controller 101 may be embodied as a general or specific purpose circuit, processing circuit, processor, state machine, etc. The PMU controller 101 interfaces with the serial interface slave 102 to communicate with the host SOC 130 over the serial interface 128, interfaces with the power rail circuits 120-124 to control and sense power that is supplied to the system 10, and interfaces with the PMU register bank 103 to store and access data associated with the status of the PMU 100 and the system 10.

The serial interface slave 102 comprises one end of the serial interface 128 that facilitates communication between the PMU 100 and the host SOC 130. Among various modes and states of operation of the system 10, the serial interface 128 is relied upon to communicate data between the PMU 100 and the host SOC 130.

The current sense circuit 107 may be relied upon by the PMU 100 to sense an amount of current being supplied by each of the power rails 120-124 in various current sense modes of operation. For example, the current sense circuit 107 may sense an amount of current supplied by one of the power rails 120-124 in a single rail operating mode or by each of the power rails 120-124 in a scan rail operating mode. According to aspects of the embodiments described below, the current sense circuit 107 may sense a replica of an amount of current supplied by one or more of the power rails 120-124. Data on the amount of current supplied by one or more of the power rails 120-124 is relied upon as power profile data by the system 10. This power profile data may be gathered by the current sense circuit 107, as further described below, at the direction of the PMU controller 101 (and/or the power manager 131) and stored in the PMU register bank 103. The power profile data may be communicated by the PMU 100 to the host SOC 130 for further evaluation and processing. In certain aspects, the power profile data may be averaged by the PMU 100 and/or the power manager 131 of the host SOC 130.

By configuring a current sense operating register of the current sense circuit 107, an operating mode of the current sense circuit 107 may be set. For example, the PMU controller 101 may set the operating mode of the current sense circuit 107 by writing values to the current sense operating register, as further described below. According to the operating mode of the current sense circuit 107, the current sense circuit 107 may measure current in single or scan rail modes of operation over a period of time and/or from time to time. Further, the current sense circuit 107 may sample and convert analog representations of the current being supplied (or a replica of the current being supplied) by one or more of the power rails 120-124 into digital values. These values may be stored in the PMU register bank 103 by the PMU controller 101 as the power profile data. In general, the power profile data may be representative of operational aspects of the system 10.

In one aspect, the current sense circuit 107 relies upon representative-scale replica power rail circuits to sense a replica of current being supplied by each of the power rails 120-124.

B. Host SOC Operation

The host SOC 130 may be generally embodied as a full system-on-chip semiconductor device. In this sense, the host SOC 130 integrates various general and/or application specific processors and processing circuits into a single integrated circuit package, reducing space. Overall, the power manager 131 of the host SOC 130 supports the host SOC 130 and the power requirements of the host SOC 130.

The power manager 131 of the host SOC 130 may retrieve and evaluate the power profile data stored in the PMU 100, while coordinating power consumption for the host SOC 130 and/or the subsystems 170-173 with the PMU 100. The power processor 132 of the power manager 131 may operate in connection with the PMU 100 to power up and power down elements in the system 10 based on the power profile data gathered by the PMU 100. On the basis of the power profile data, the power processor 132 and the PMU 100 may power up or power down elements in the system 10.

In the context of power usage by the host SOC 130, it is noted that each of the power manager 131, the application processor 140, the modem 141, and the graphics processor 142 may be powered by a respective power rail of the PMU 100 in the system 10. For example, in the embodiment illustrated in FIG. 1, the power manager 131 is powered by the power manager power rail 122, and the application processor 140 is powered by the application processor power rail 124. Each of these power rails may be electrically coupled from the PMU 100 to the host SOC 130 by one or more respective power traces in the system 10 and power pins or pads of the PMU 100 and the host SOC 130. Other power rails of the PMU 100 are respectively coupled to system elements in the system 10, as necessary, for supplying power. According to certain aspects described herein, because the power manager 131 of the host SOC 130 operates as a type of partner with the PMU 100 for power management in the system 10, the PMU 100 generally provides powers to the power manager 131 even while remaining processors and systems of the host SOC 130 and/or the system 10 are left without power until a later time.

According to aspects of the embodiments described herein, the power processor 132 may request and retrieve the power profile data stored by the PMU 100. In one embodiment, the power processor 132 may request and retrieve the power profile data on the basis of or in response to an interrupt set by the PMU 100.

Figure 2:
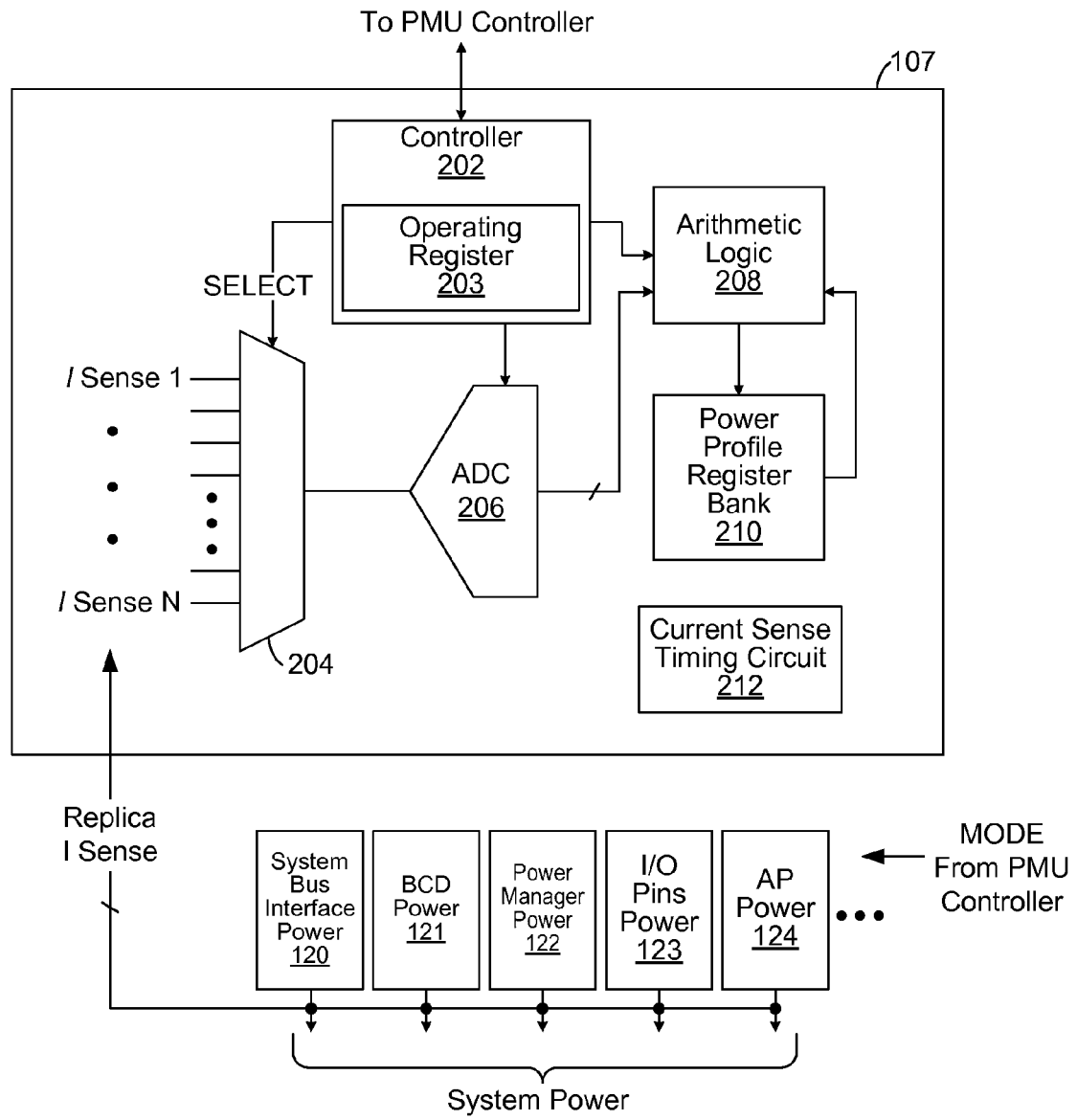
FIG. 2 illustrates elements of a current sense circuit of the system of FIG. 1 according to an example embodiment.

Turning to FIG. 2, elements of the current sense circuit 107 of the system 10 of FIG. 1 are illustrated according to an example embodiment. In FIG. 2, the current sense circuit 107 includes a current sense controller 202, a multiplexer 204, an analog-to-digital converter (ADC) 206, arithmetic logic 208, a power profile register bank 210, and a current sense timing circuit 212. In one embodiment, the power profile register bank 210 may be embodied as part of the PMU register bank 103. The current sense controller 202 includes a current sense operating register 203 that is accessible to the PMU controller 101. Generally, the current sense operating register 203 includes registers or logic entries to define modes of operation of the current sense circuit 107 and to select one or more of the power rails 120-124 for current sensing, for example.

As illustrated in FIG. 2, replica current sense signals are provided from the power rails 120-124 to the multiplexer 204. The generation of the replica current sense signals is described in further detail below with reference to FIGS. 3A and 3B. In one embodiment, each replica current sense signal includes a voltage that is representative of an amount of current being supplied by a respective one of the power rails 120-124. Generally, after a replica current is generated by one of the circuits illustrated in FIG. 3A or 3B, for example, the replica current may be passed through a current sense resistor to generate a voltage representative of an amount of current. The voltage, in turn, may be sampled by the ADC 206. The current sense resistor, among embodiments, may be integrated with the multiplexer 204 or at another suitable location within the current sense circuit 107 or the PMU 100.

Depending upon the mode of operation of the power rails 120-124, each of the replica currents may include a representative ratio of an amount of current being supplied by a respective one of the power rails 120-124. It is again noted that the PMU 100 may include power rails in addition to the power rails 120-124 illustrated in FIG. 2. In various embodiments, the PMU 100 may include a power rail for each processor, memory, subsystem, etc. of the system 10. Further, the PMU 100 may include power rails for input/output (I/O) pins of one or more integrated semiconductor devices in the system 10. Thus, in various embodiments, the PMU 100 may include more or less than twenty or thirty power rails, for example, although the PMU 100 may include any number of power rails among embodiments.

In general, each of the power rails 120-124 includes a low dropout regulator (LDO) or switching type of power rail. An LDO power rail includes a linear voltage regulator that operates suitably even with a relatively low differential input vs. output voltage. A switching power rail includes an active switching circuit that charges and/or discharges reactive circuit elements to boost voltage or current, for example. It should be appreciated that an LDO or switching power rail is selected for each of the power rails 120-124 depending upon certain factors such as output voltage, input/output differential voltage, sourced current, power dissipation, cost, etc. In one embodiment, the PMU 100 includes 8 switching and 24 LDO power rails. As further described below with reference to FIGS. 3A and 3B, each replica current sense signal may be generated by either an LDO replica current sense circuit or a switching regulator replica current sense circuit depending upon the type of power rail.

The PMU 100 may set operating parameters for each of the power rails 120-124. For example, among other operating parameters, each of the power rails 120-124 may be set to on or off modes of operation, to a certain output voltage, and to either a normal or low power mode of operation by the PMU 100. It is also noted that the PMU 100 may set operating parameters of one or more of the power rails 120-124 according to commands received from the power manager 131 via the serial interface 128. As further described below, an accuracy of power profile data collected or sensed by the current sense circuit 107 may depend, at least in part, on various operating parameters of the power rails 120-124.

Returning to a description of the elements of the current sense circuit 107, the current sense controller 202 coordinates the operation of the current sense circuit 107. Particularly, the current sense controller 202 coordinates sampling of the replica current sense signals over time with reference to a phase locked loop clocking signal, for example, provided by the current sense timing circuit 212. The current sense controller 202 may be configured for operation based on a current sense operating register 203 accessible to the PMU controller 101. The PMU controller 101 may write logic values to certain bits of the current sense operating register 203 to coordinate the operation of the current sense circuit 107.

Using the current sense operating register 203, the PMU controller 101 may enable or disable the current sense circuit 107. Further, the PMU controller 101 may operate the current sense circuit 107 in one or more modes of operation by writing to one or more mode bits of the current sense operating register 203. In one embodiment, the modes of operation include single and scan modes of operation, each of which is described in further detail below with reference to FIGS. 4A and 4B, respectively. Additionally, the current sense circuit 107 may set certain logic values in the current sense operating register 203 to identify when valid power profile data has been sampled, accumulated, and stored in the register bank 210.

In operation, the multiplexer 204 of the current sense circuit 107 selects one of the replica current sense signals from the power rails 120-124 according to a select signal from the current sense controller 202, as illustrated in FIG. 2. In one embodiment, the ADC 206 includes a successive approximation register ADC that outputs a 10-bit digital sample value, although the use of other types of ADCs is within the scope and spirit of the embodiments described herein. In one sampling mode, each replica current sense signal is multiplexed to the ADC 206 by the multiplexer 204 and sampled or converted by the ADC 206 several times over a period of time. Each digital sample value output by the ADC 206 is accumulated by the arithmetic logic 208 and stored in the register bank 210. In one embodiment, four 10-bit digital sample values are accumulated for each power rail to arrive at a 12-bit summation. The summation may be averaged (e.g., divided by four) to arrive at a representative average value of an amount of current being supplied by a corresponding power rail.

As the multiplexer 204 selects respective ones of the replica current sense signals over time, the ADC 206 samples or converts the replica current sense signal voltages into digital values, and the arithmetic logic 208 accumulates the digital values and stores them in the register bank 210. After a period of time, the current sense controller 202 sets one or more bits in the current sense operating register 203 to indicate that valid power profile data entries are available in the register bank 210. Based on the indication of valid power profile data entries, the PMU controller 101 may send an interrupt to the host SOC 130, and the power processor 132 of the host SOC 130 may, in response to the interrupt, send a command to the PMU 100 to retrieve the power profile data entries. Based on the command from the power processor 132, the PMU 100 may return the power profile data entries to the power processor 132 for further evaluation.

Figure 3A:
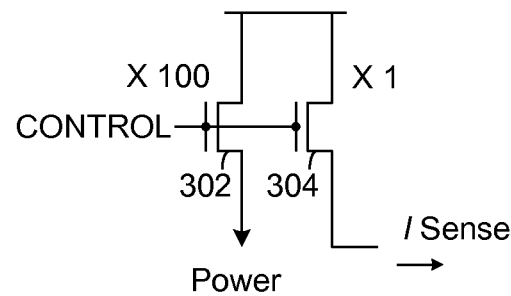
FIG. 3A illustrates a representative schematic diagram of a low dropout regulator replica and current sense circuit of the system of FIG. 1 according to an example embodiment.

FIG. 3A illustrates a representative schematic diagram of an LDO 302 and replica current sense circuit 304 of the system of FIG. 1 according to an example embodiment. Generally, FIG. 3A illustrates representative diagrams of the LDO 302 and replica current sense circuits 304. That is, the circuits 302 and 304 are not intended to be limiting or exclusive. Rather, the circuits 302 and 304 are intended to illustrate the principles of operation of the embodiments described herein.

The LDO 302 and replica current sense circuits 304 are controlled by a control signal, as illustrated in FIG. 3A. In aspects of the embodiments described herein, the replica current sense circuit 304 is embodied as a ratioed replica of the LDO 302. In other words, for example, if the LDO 302 relies upon 100 power transistors of a certain sizing for regulation of output power, the replica current sense circuit 304 relies upon a single power transistor of the same sizing for the generation of a corresponding replica current sense signal. In this manner, the actual amount of current output by the LDO 302 may be estimated as a 100:1 times ratio of the replica current sense signal.

According to other aspects of the embodiments, the ratio of current supplied by the LDO 302 as compared to the replica current sense circuit 304 may be dependent, in part, upon the mode of the LDO 302. As described above, each power rail may be operated in normal or low power modes of operation. Thus, when the LDO 302 is operated in a low power mode of operation, a number of the power transistors for regulation of output power may be turned off. In this case, if 90 of the 100 power transistors of the LDO 302 are turned off, then the ratio of the transistors in the LDO 302 vs. the number of transistors in the replica current sense circuit 304 is adjusted from 100:1 to 10:1. This, in turn, leads to a more accurate measurement of current via replica current sense signals. Thus, when storing power profile information for one or more of the power rails, the power mode (i.e., normal or low power mode) of each of the one or more power rails may be stored in association with any measurement of current gathered.

Figure 3B:
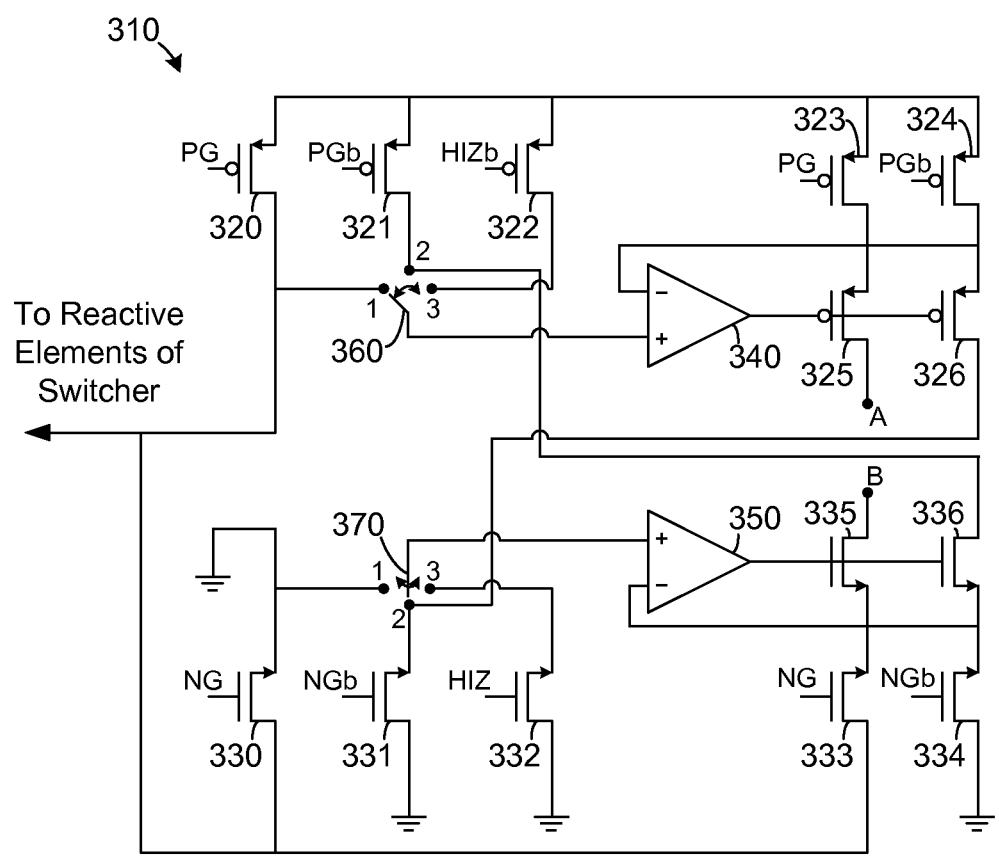
FIG. 3B illustrates a representative schematic diagram of a switching regulator replica and current sense circuit of the system of FIG. 1 according to an example embodiment.

FIG. 3B illustrates a representative schematic diagram of a switching regulator replica current sense circuit 310 of the system 10 of FIG. 1 according to an example embodiment. Generally, FIG. 3B illustrates representative diagrams of the switching replica current sense circuit 310. That is, the elements and arrangement of the elements of the switching replica current sense circuit 310 are not intended to be exhaustive or exclusive. Rather, the switching replica current sense circuit 310 is intended to illustrate the principles of operation of the embodiments described herein.

The switching regulator replica current sense circuit 310 includes power switching transistors 320 and 330, dummy power switching transistors 321 and 331, high impedance state transistors 322 and 332, replica power transistors 323 and 333, bias transistors 325, 326, 335, and 336, matching amplifiers 340 and 350, and selector switches 360 and 370. In aspects of the embodiments described herein, the replica power transistors 323 and 333 are embodied as ratioed replicas of the power switching transistors 320 and 330, respectively. The dummy power switching transistors 321 and 331 are embodied as transistors that match, at least in part, the characteristics of the power switching transistors 320 and 330, respectively.

In operation, the power switching transistors 320 and 330 and the replica power transistors 323 and 333 are driven by the control signals PG and NG, and the outputs of the switching transistors 320 and 330 are relied upon in the circuit 310 to drive reactive elements for a switching regulator power rail. In other words, outputs of the switching transistors 320 and 330 are relied upon to charge and discharge one more inductors and/or capacitors in a switching regulator for a power rail. The dummy power switching transistors 321 and 331 are driven by the control signals PGb and NGb which include inverse logic levels as compared to the control signals PG and NG.

The replica power transistors 323 and 333 are relied upon to generate a replica current sense signal. Particularly, the outputs A and B of the power switching transistors 320 and 330 are combined or summed using one or more current mirrors, for example, to generate a replica current sense signal. Other than the power switching transistors 320 and 330 and the replica power transistors 323 and 333, the other elements in the switching replica current sense circuit 310 are generally relied upon for circuit biasing to achieve a relatively accurate replica current sense signal. For example, some of the other elements in the switching replica current sense circuit 310 are relied upon to reduce the effect of "dead time" when switching between the power switching transistors 320 and 330, which are operated alternatively over time.

The matching amplifiers 340 and 350 are relied upon to help match the bias voltages on the replica power transistors 323 and 333 by referencing to and comparing with the bias voltages of the power switching transistors 320 and 330. Further, depending upon the operating mode of the switching replica current sense circuit 310 and which of the power switching transistors 320 and 330 is turned on, each of the selector switches 360 and 370 is transitioned between one of the positions 1, 2, and 3 in FIG. 3B.

As illustrated in FIG. 3B, when the power switching transistor 320 is powered on by the PG control signal and the power switching transistor 330 is powered off by the NG control signal, the switch 360 is coupled to the output of the power switching transistor 320, and the switch 370 is coupled to the output of the dummy power switching transistor 331. In this case, when the power switching transistor 320 is powered on by the PG control signal, the matching amplifier 340 biases the replica power transistor 323, in connection with the bias transistors 325 and 326, with reference to the bias voltage at the output of the power switching transistor 320 via the switch 360. At the same time, the matching amplifier 350 biases the dummy replica power transistor 334, in connection with the bias transistors 335 and 336, with reference to the bias voltage at the output of the dummy power switching transistor 331 via the switch 370.

In another mode of operation, when the power switching transistor 330 is powered on by the NG control signal and the power switching transistor 320 is powered off by the PG control signal, the switch 370 is coupled to the output of the power switching transistor 330, and the switch 360 is coupled to the output of the dummy power switching transistor 321. In this case, when the power switching transistor 330 is powered on by the NG control signal, the matching amplifier 350 biases the replica power transistor 333, in connection with the bias transistors 335 and 336, with reference to the bias voltage at the output of the power switching transistor 330 via the switch 370. At the same time, the matching amplifier 340 biases the dummy replica power transistor 324, in connection with the bias transistors 325 and 326, with reference to the bias voltage at the output of the dummy power switching transistor 321 via the switch 360.

In another mode of operation, when both the power switching transistors 320 and 330 are off, the switches 360 and 370 are respectively coupled to the outputs of the high impedance state transistors 322 and 332, which are turned on by the control signals HIZ and HIZb. In this case, the switching regulator replica current sense circuit 310 is set to a predetermined state and the replica power transistors 323 and 333 are turned off.

According to other aspects of the embodiments, the ratio of current supplied by the power switching transistors 320 and 330 as compared to the replica power transistors 323 and 333 may be dependent, in part, upon the mode of operation of the switching replica current sense circuit 310. As described above, each power rail may be operated in normal or low power modes of operation. In a normal mode of operation, more power switching transistors 320 and 330 may be active as compared to a low power mode of operation. Thus, when the replica power transistors 323 and 333 are operated in a low power mode of operation, a ratio of the number of the power switching transistors 320 and 330 vs. the number of the replica power transistors 323 and 333 is adjusted. This, in turn, leads to a more accurate measurement of current via replica current sense signals. Thus, when storing power profile information for one or more of the power rails, the power mode (i.e., normal or low power mode) of each of the one or more power rails may be stored in association with any measurement of current gathered.

Figure 4A:
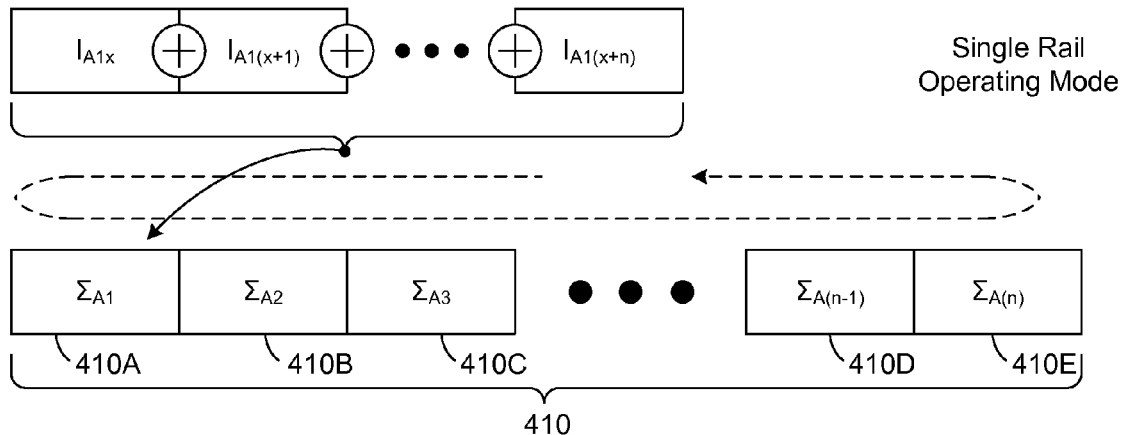
FIG. 4A illustrates a single rail operating mode of the current sense circuit of the system of FIG. 1 according to an example embodiment.
Figure 4B:
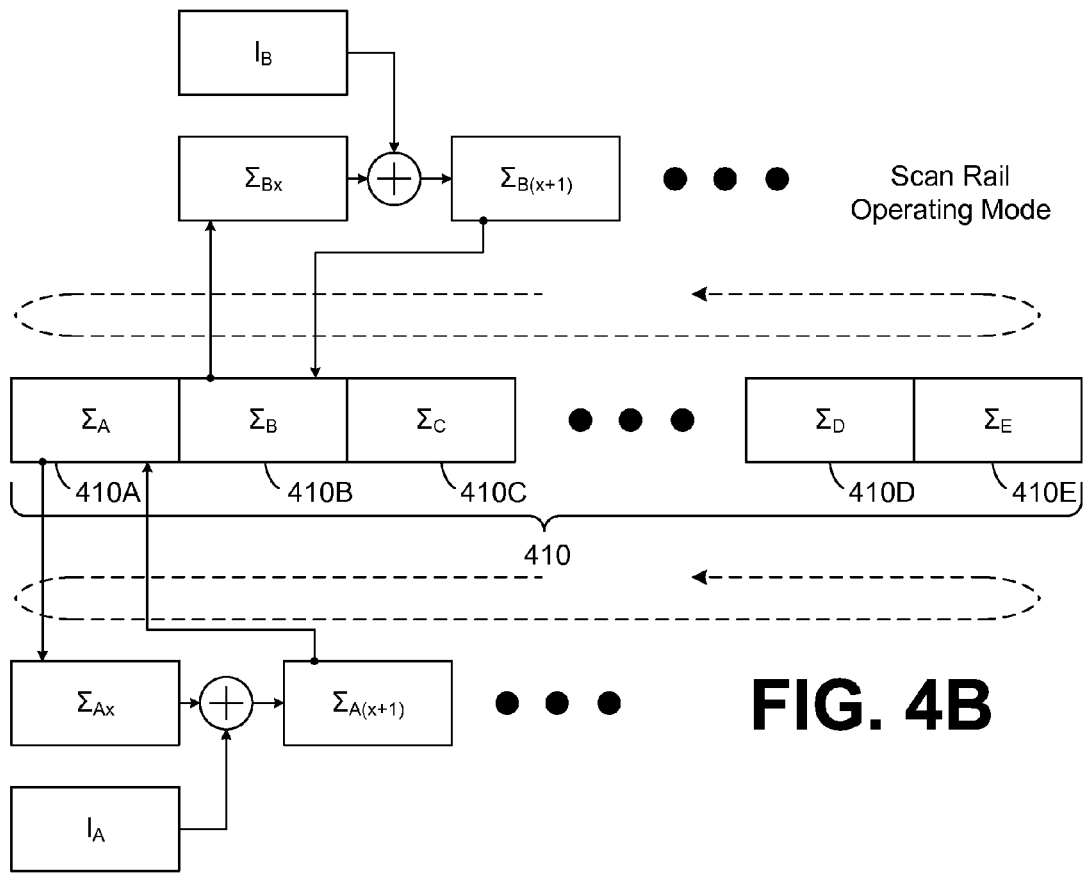
FIG. 4B illustrates a scan rail operating mode of the current sense circuit of the system of FIG. 1 according to an example embodiment.

Before turning to FIGS. 4A and 4B, it is noted that the current sense controller 202 may be configured to select the replica current sense signals for sampling via the multiplexer 204 in any order, in a sequence, or randomly, in various embodiments. In other words, the sampling and accumulation of power profile data, as illustrated in the examples of FIGS. 4A and 4B, is not intended to be limiting. Other sequences, orders, etc., of sampling and accumulating power profile data are within the scope and spirit of the embodiments described herein.

FIG. 4A illustrates a single rail operating mode of the current sense circuit 107 of the system 10 of FIG. 1 according to an example embodiment, and FIG. 4B illustrates a scan rail operating mode of the current sense circuit 107 of the system 10 of FIG. 1 according to an example embodiment. Generally, the single rail operating mode permits more accurate measurement and power profiling of a single power rail of the PMU 100, and the scan rail operating mode permits relatively less accurate measurement and power profiling but for each of the power rails of the PMU 100.

In FIG. 4A, a register 410 of the power profile register bank 210 (FIG. 2) is illustrated. The register 410 includes one or more summation registers 410A-410E. Each summation register 410A-410E may store accumulated digital values ($\Sigma_{A1}$, $\Sigma_{A2}, \Sigma_{A3}, \ldots \Sigma_{A(n)}$) output by the ADC 206 (FIG. 2). It is noted that, in one example embodiment, the register 410 includes a summation register 410A-410E for each power rail in the PMU 100 and, as described above, the PMU 100 may include twenty, thirty, or more power rails. Generally, the PMU 100 may include any number of power rails among embodiments, and the register 410 may include a summation register 410A-410E for each power rail in the PMU 100, In the single rail operating mode illustrated in FIG. 4A, the summation register 410A is relied upon to store an accumulated digital value ($\Sigma_{A1}$) of samples from a single replica current sense signal (i.e., from a power rail) sampled consecutively over time. That is, in one embodiment of the single rail operating mode, the current sense controller 202 (FIG. 2) is configured to select a single one of the replica current sense signals for sampling over consecutive sampling time periods of the ADC 206. In this case, for example, each of the summation registers 410A-410E may be relied upon to store an accumulated number of digital values output over consecutive sampling time periods by the ADC 206.

More particularly, with reference between FIGS. 2 and 4A, the current sense controller 202 may be configured to select a first replica current sense signal using the multiplexer 204, and the ADC 206 may convert or sample a voltage of the first replica current sense signal consecutively over time. In turn, for each of the summation registers 410A-410E, the arithmetic logic 208 may accumulate a certain number of consecutive digital output values (i.e., $I_{A1x}, I_{A1(x+1)}, \ldots I_{A1(x+n)}$) from the ADC 206 over time, and store the accumulation to a summation register 410A-410E. Upon accumulating and storing the certain number of digital output values for one of the summation registers 410A-410E, the arithmetic logic 208 may accumulate the number of digital output values for a next one of the summation registers 410A-410E.

In this mode of operation, a relatively accurate average value of current being supplied by a selected power rail may be obtained. In this mode, the selected power rail (and associated replica current sense signal) may be identified for the current sense controller 202 based on a selection entry in the current sense operating register 203. In other words, the current sense controller 202 may identify a replica current sense signals for sampling based the selection entry in the current sense operating register 203. The selection entry may be set by the PMU controller 101 at the direction of the power manager 131, for example.

After an accumulation is stored into each of the summation registers 410A-410E, which may take a certain period of time, the current sense controller 202 and/or the PMU controller 101 may send an interrupt to the host SOC 130. As described above, the power processor 132 of the host SOC 130 may, in response to the interrupt, send a command to the PMU 100 to retrieve the power profile data entries stored in the summation registers 410A-410E.

It is noted that, in various embodiments of the single rail operating mode, the number of digital output values accumulated for each of the summation registers 410A-410E may vary. In various embodiments, 2, 4, 6, 8, or any other number of digital output values may be accumulated for each of the summation registers 410A-410E. The number of accumulated digital output values may depend, in part, upon the processing capabilities of the PMU 100, a frequency at which the current sense controller 202 and/or the PMU controller 101 should interrupt the host SOC 130, or the processing capabilities of the power processor 132 and/or the host SOC 130, for example.

In the scan rail operating mode illustrated in FIG. 4B, each summation register 410A-410E is relied upon to store an accumulated digital value ($\Sigma_A, \Sigma_B, \Sigma_C, \ldots \Sigma_E$) of samples from a respective replica current sense signal (i.e., from a power rail). In this case, samples from different replica current sense signals are accumulated and stored over time in an interleaved fashion. That is, in one embodiment of the scan rail operating mode, the current sense controller 202 (FIG. 2) is configured to select respective ones of the replica current sense signals for sampling over consecutive sampling time periods of the ADC 206. In this case, for example, each of the summation registers 410A-410E may be relied upon to store an accumulated number of digital values for a respective one of the replica current sense signals.

More particularly, with reference between FIGS. 2 and 4B, the current sense controller 202 may be configured to select a first replica current sense signal using the multiplexer 204. The ADC 206 may convert or sample a voltage of the first replica current sense signal into a first digital value $I_A$ during a first time period. The first digital value $I_A$ may be accumulated with a current value $\Sigma_{Ax}$ of the first summation register 410A (i.e., $\Sigma_{Ax}+I_A$) by the arithmetic logic 208, and the result of the summation $\Sigma_{Ax+1}$ may be stored to the first summation register 410A. In turn, the current sense controller 202 selects a second replica current sense signal using the multiplexer 204. The ADC 206 may convert or sample a voltage of the second replica current sense signal into a second digital value $I_B$ during a second time period. The second digital value $I_B$ may be accumulated with a current value $\Sigma_{Bx}$ of the second summation register 4108 (i.e., $\Sigma_{Bx}+I_B$) by the arithmetic logic 208, and the result of the summation $\Sigma_{Bx+1}$ may be stored to the second summation register 410B.

This process of accumulating and storing digital values of replica current sense signals, interleaved over time, continues for a number of the power rails and replica current sense signals. In embodiments where the number of summation registers 410A-410E is equal to the number of power rails, the accumulating may occur for each replica current sense signal and power rail. When a last replica current sense signal and power rail is reached, the process may repeat back to update the current value $\Sigma_{Ax}$ of the first summation register 410A with an additional value of the first replica current sense signal, update the current value $\Sigma_x$ of the second summation register 4108 with an additional value of the second replica current sense signal, etc., and repeat. The process may repeat a certain number of times for each replica current sense signal and power rail.

In this mode of operation, a relatively less accurate average value of current being supplied by each power rail may be obtained. After an accumulation is stored into each of the summation registers 410A-410E for a respective power rail, which may take a certain period of time, the current sense controller 202 and/or the PMU controller 101 may send an interrupt to the host SOC 130. As described above, the power processor 132 of the host SOC 130 may, in response to the interrupt, send a command to the PMU 100 to retrieve the power profile data entries stored in the summation registers 410A-410E.

It is noted that, in various embodiments of the scan rail operating mode, the number of digital output values accumulated for each of the summation registers 410A-410E may vary. In various embodiments, 2, 4, 6, 8, or any other number of digital output values may be accumulated for each of the summation registers 410A-410E. The number of accumulated digital output values may depend, in part, upon the processing capabilities of the PMU 100, a frequency at which the current sense controller 202 and/or the PMU controller 101 should interrupt the host SOC 130, or the processing capabilities of the power processor 132 and/or the host SOC 130, for example. Based on the number of digital output values accumulated in the summation registers 410A-410E, each of the accumulated digital output values may be divided by the number of values accumulated, to arrive at an average value of the amount of current for each.

Figure 5:
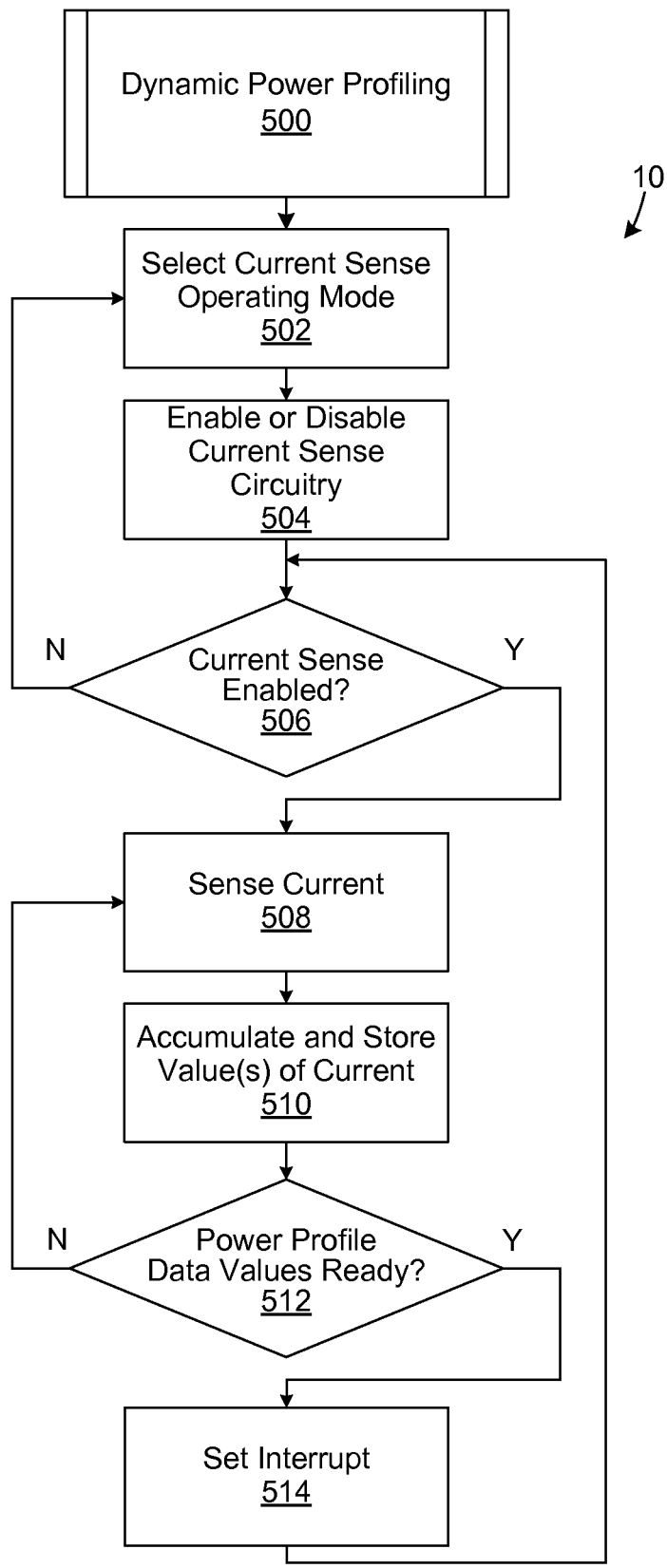
FIG. 5 illustrates a process flow diagram for a method of dynamic power profiling performed by the system of FIG. 1 according to an example embodiment.
Figure 6:
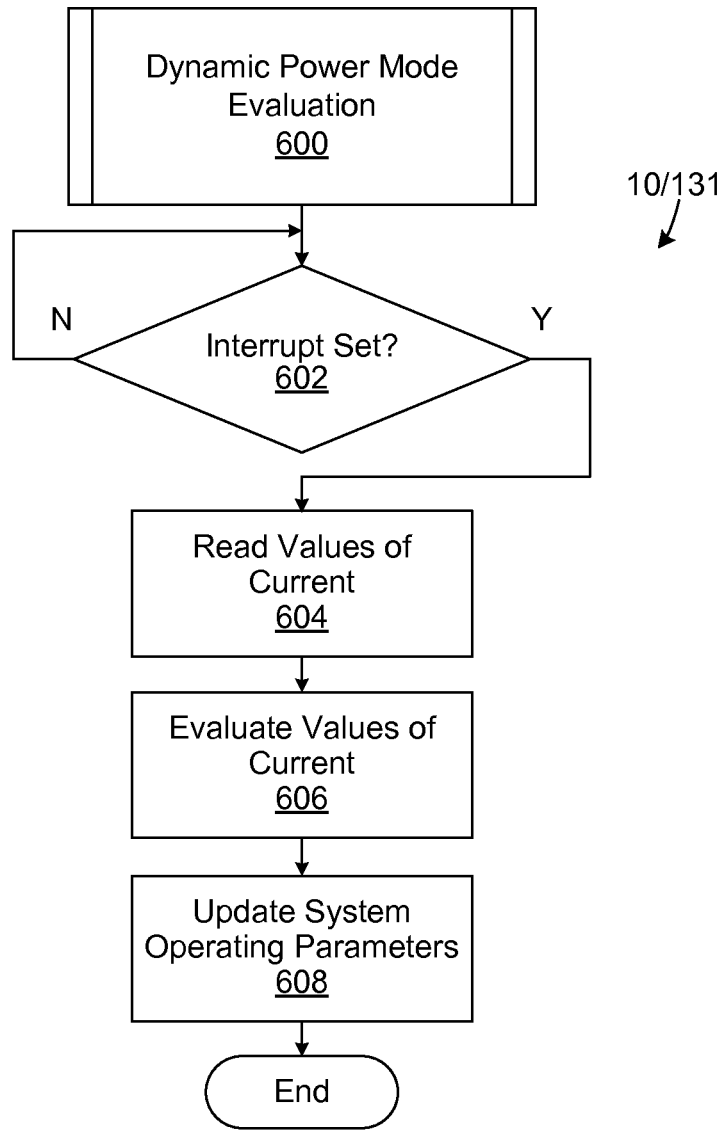
FIG. 6 illustrates a process flow diagram for a method of dynamic power mode evaluation performed by the system of FIG. 1 according to an example embodiment.

Turning to FIGS. 5 and 6, process flow diagrams illustrating example processes performed by a system for dynamic power profiling are illustrated. While the process flow diagrams are described in connection with the system 10 of FIG. 1, it is noted that other systems may perform the illustrated processes. That is, in various embodiments, systems similar to the system 10 may perform the processes illustrated in FIGS. 5 and 6.

In certain aspects, the flowcharts of FIGS. 5 and 6 may be considered to depict example steps performed by the system 10 according to one or more embodiments. Although the process diagrams of FIGS. 5 and 6 illustrate an order, it is understood that the order may differ from that which is depicted. For example, an order of two or more elements in the process may be scrambled relative to that shown, performed concurrently, or performed with partial concurrence. Further, in some embodiments, one or more of the elements may be skipped or omitted within the scope and spirit of the embodiments described herein.

FIG. 5 illustrates a process flow diagram for a method 500 of dynamic power profiling performed by the system 10 of FIG. 1 according to an example embodiment. Starting at reference numeral 502, the method 500 includes setting a current sense operating mode for a current sense circuit. For example, the PMU controller 101 may set a current sense operating mode of the current sense circuit 107 (FIG. 2), based on settings in a current sense operating register 203. Setting the current sense operating mode may include selecting one of the single rail operating mode (e.g., FIG. 4A) or the scan rail operating mode (e.g., FIG. 4B). Setting the current sense operating mode may also include identifying, for the single rail operating mode, a power rail or replica current sense signal for measurement. It is noted that the settings for dynamic profiling may be changed by the PMU controller 101 at any time. It is also noted that, in certain circumstances, the PMU 100 receives commands to set the current sense operating mode from the power manager 131 of the host SOC 130. In one embodiment, any power profile data gathered by the PMU 100 is communicated to the power manager 131 of the host SOC 130 for evaluation.

At reference numeral 504, the method 500 includes enabling the current sense circuit 107 for operation. For example, the PMU controller 101 may enable the current sense circuit 107 at reference numeral 504 by writing to the current sense operating register 203. At reference numeral 506, the method 500 includes determining whether current sense operations are enabled. If, at reference numeral 506, the current sense circuit 107 determines that current sense operations are enabled according to the current sense operating register 203, then the process 500 proceeds to reference numeral 508. Otherwise, if, at reference numeral 506, the current sense circuit 107 determines that current sense operations are not enabled, then the process 500 proceeds back to reference numeral 502.

At reference numeral 508, the method 500 includes sensing an amount of current supplied by at least one of a plurality of power rails. The sensing at reference numeral 508 may be based on a current sense operating mode. In this context, the current sense circuit 107 senses an amount of current supplied by at least one of the plurality of power rails, with reference to one or more corresponding replica current sense signals, for example, as described herein. The sensing of current may be based on either the single or scan rail operating modes of FIG. 4A or 4B, for example. Operation in one of the single or scan rail operating modes may be determined based on settings set by the PMU controller 101 in the current sense operating register 203. Further, when replica currents from replica current sense circuits are relied upon, the sensing at reference numeral 508 may include sensing a predetermined ratio of the amount of current provided by at least one of the plurality of power rails based on an operating mode of the at least one of the plurality of power rails. That is, the predetermined ratio may depend upon whether each of the plurality of power rails are operating, respectively, in normal or low power modes.

At reference numeral 510, the method 500 includes accumulating and storing a value of the amount of current supplied by the at least one of the plurality of power rails over a period of time. The accumulating and storing may be performed by the current sense circuit 107 according to either one or a combination of the single or scan rail operating modes described above with reference to FIG. 4A or 4B, for example. The values may be stored in the register bank 210 (FIG. 2) of the current sense circuit 107 as power profile information for power rails of the PMU 100, as described herein. Also, as described above, a mode of each of the power rails may be stored. In this manner, a ratio of a current sensed from a replica current sense signal may be evaluated in connection with an actual current supplied by a corresponding power rail.

At reference numeral 512, the method 500 includes determining whether the power profile data values accumulated and stored at reference numeral 510 are ready. In various embodiments, the power profile data values may be ready after a certain period of time, after a certain number of values of current are accumulated and stored, after a certain number of values of current are accumulated and stored for one power rail, after a certain number of values of current are accumulated and stored for each power rail of the PMU 100, etc. If, at reference numeral 512, the current sense circuit 107 determines that the power profile data values are ready, then the process 500 proceeds to reference numeral 514. Otherwise, if, at reference numeral 512, the current sense circuit 107 determines that the power profile data values are not ready, then the process 500 proceeds back to reference numeral 508. At reference numeral 514, the method 500 includes setting an interrupt. Here, in one embodiment, an interrupt to the host SOC 130 may be set by the current sense circuit 107 and/or the PMU controller 101. In another embodiment, an interrupt to the PMU controller 101 may be set by the current sense circuit 107.

FIG. 6 illustrates a process flow diagram for a method 600 of dynamic power mode evaluation performed by the system 10 of FIG. 1 according to an example embodiment. At reference numeral 602, the process 600 includes determining whether an interrupt is set. As described above, in one embodiment, when power profile data is ready for evaluation, an interrupt may be set in either the host SOC 130 and/or the PMU controller 101. If the interrupt is set, then the process 600 proceeds to reference numeral 604. Otherwise, if the interrupt is not set, the process 600 proceeds back to reference numeral 602.

At reference numeral 604, the method 600 includes reading values of current or power profile data stored by the PMU 100. The values of current may be read by the PMU controller 101 or by the host SOC 130. If read by the host SOC 130, the PMU 100 may receive one or more commands to retrieve the values of current via the serial interface 128. In the context of the current sense circuit of FIG. 2, the values of current may be values of current accumulated for at least one of power rails 120-124 of the PMU 100 over a period of time. In various embodiments, the values of current may be read from the power profile register bank 210 of the current sense circuit 107, for example, and/or from the PMU register bank 103, depending upon where the values were stored. In connection with reading the values of current, the PMU controller 101 or host SOC 130 may also read various operating values from the PMU register bank 103 and/or from the power profile register bank 210. These operating values may identify the operating mode of the PMU 100, the operating mode of the power rails 120-124, and the operating mode of the current sense circuit 107.

At reference numeral 606, the method 600 includes evaluating the values of current read at reference numeral 606. The values of current may be evaluated by the PMU controller 101 and/or by the host SOC 130. The evaluating at reference numeral 606 may include averaging, by the PMU controller 101 and/or by the host SOC 130, at least one of the values of current read at reference numeral 606. For example, the averaging may include averaging at least one of the values of current based on the operating mode of the current sense circuit 107 during which the values were accumulated and stored. In other words, depending upon whether the values of current were accumulated and stored for one of the power rails 120-124 of the PMU 100 in the single rail operating mode, or were accumulated and stored for each of the power rails 120-124 of the PMU 100 in the scan rail operating mode, the averaging at reference numeral 606 may include averaging the values for the one of the power rails 120-124 or for each of the power rails 120-124.

Further, the evaluating at reference numeral 606 may include averaging the values of current with reference to a predetermined ratio of currents supplied by at least one of the power rails 120-124, based on a power mode of the plurality of power rails. That is, as discussed above, depending upon whether each of the power rails 120-124 was operating in a normal or low power mode of operation while the values of current were accumulated and stored, a result of the averaging may be considered in connection with a predetermined ratio of the values of current read at reference numeral 606 and the amounts of current actually sourced by the corresponding power rails 120-124, as described above with reference to FIGS. 3A and 3B, for example.

At reference numeral 608, the method 600 includes updating system operating parameters 608 based on the evaluating at reference numeral 606. Generally, operating parameters of the system 10 may be updated in view of the evaluating at reference numeral 606. For example, if a certain power rail is identified as sourcing an unexpectedly high amount of current for the current operating conditions of the system 10, the host SOC and/or the PMU 100 may turn the power rail off, adjust the output voltage of the power rail, etc.

Overall, because the current sense circuit 107 may be relied upon, in various modes of operation, to measure and sense current that is being sourced by each of a plurality of power rails, the system 10 can configure itself in a more dynamic and flexible manner. Troubleshooting problems within the host SOC 130, the subsystems 170-173, and other elements of the system 10 may also be easier based on the power profile data gathered by the current sense circuit 107.

With regard to aspects of the structure or architecture of the system 10, in various embodiments, each of the PMU controller 101, the power processor 132, and or other processors or processing circuits of the system 10 may comprise general purpose arithmetic processors, state machines, or Application Specific Integrated Circuits ("ASICs"), for example. Each such processor or processing circuit may be configured to execute one or more computer-readable software instruction modules. In certain embodiments, each processor or processing circuit may comprise a state machine or ASIC, and the processes described in FIGS. 5 and 6 may be implemented or executed by the state machine or ASIC according to the computer-readable instructions.

The memories and/or registers described herein may comprise any suitable memory devices that store computer-readable instructions to be executed by processors or processing circuits. These memories and/or registers store computer-readable instructions thereon that, when executed by the processors or processing circuits, direct the processors or processing circuits to execute various aspects of the embodiments described herein.

As a non-limiting example group, the memories and/or registers may include one or more of an optical disc, a magnetic disc, a semiconductor memory (i.e., a semiconductor, floating gate, or similar flash based memory), a magnetic tape memory, a removable memory, combinations thereof, or any other known memory means for storing computer-readable instructions.

In certain aspects, the processors or processing circuits are configured to retrieve computer-readable instructions and/or data stored on the memories and/or registers for execution. The processors or processing circuits are further configured to execute the computer-readable instructions to implement various aspects and features of the embodiments described herein.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

The invention claimed is:

1. A current sensor circuit, comprising:
a control circuit configured to provide a selection signal to a multiplexor;
a converter; and
the multiplexor, which is configured to
receive a plurality of replica current sense signals from a plurality of power rails, each replica current sense signal representing an amount of current supplied from a corresponding power rail,
receive the selection signal from the control circuit,
select a first replica current sense signal according to the selection signal, and
output the first replica current sense signal to the converter, wherein
the converter is configured to convert the first current sense signal to a value that represents an amount of current supplied from a first power rail, the first power rail corresponding to the first replica current sense signal.

2. The current sensor circuit according to claim 1, further comprising:
a logic circuit that accumulates the value; and
a register bank that stores the value.

3. The current sensor circuit according to claim 1, wherein
the control circuit receives a current sense operating mode from a power management controller, and
the control circuit provides the selection signal to the multiplexor according to the current sense operating mode.

4. The current sensor circuit according to claim 3, wherein the current sense operating mode received from the power management controller is one of a single rail or scan rail operating mode.

5. The current sensor circuit according to claim 1, wherein
the control circuit supplies the selection signal to the multiplexor during each of a plurality of consecutive sampling intervals, and
during each sampling interval, the multiplexor selects and outputs, to the converter, one of the replica current sense signals according to the selection signal received by the multiplexor corresponding to the sampling interval.

6. The current sensor circuit according to claim 5, wherein for each replica current sense signal received from the multiplexor, the converter converts the replica current sense signal to a value that represents an amount of current supplied from the power rail corresponding to the replica current sense signal.

7. A system, comprising:
a replica current sense circuit configured to generate a plurality of replica current sense signals, each represent an amount of current supplied by a corresponding power rail of a plurality of power rails;
a current sense circuit that includes
a control circuit configured to provide a selection signal to a multiplexor, and
the multiplexor, which is configured to receive the plurality of replica current sense signals from the replica current sense circuit, receive the selection signal from the control circuit, and select a first replica current sense signal according to the selection signal; and
a power management controller configured to accumulate and store a total value of the amount of current supplied by the plurality of power rails.

8. The system according to claim 7, wherein the power management controller selects a current sense operating mode for the current sense circuit and supplies the current sense operating mode to the control circuit.

9. The system according to claim 7, wherein
the control circuit supplies the selection signal to the multiplexor during each of a plurality of consecutive sampling intervals, and
during each sampling interval, the multiplexor selects and outputs one of the replica current sense signals according to the selection signal received by the multiplexor corresponding to the sampling interval.

10. The system according to claim 7, wherein the current sense circuit further includes a converter that converts the first current sense signal to a first value that represents an amount of current supplied from a first power rail, the first power rail corresponding to the first replica current sense signal.

11. The system according to claim 10, wherein
the control circuit provides the selection signal to the multiplexor during each of a plurality of consecutive sampling intervals, and
during each sampling interval, the multiplexor selects and outputs, to the converter, one of the replica current sense signals according to the selection signal received by the multiplexor corresponding to the sampling interval.

12. The system according to claim 11, wherein for each replica current sense signal received from the multiplexor, the converter converts the replica current sense signal to a value that represents an amount of current supplied from the power rail corresponding to the replica current sense signal.

* * * * *